(12) United States Patent
You

(10) Patent No.: US 8,360,228 B2
(45) Date of Patent: Jan. 29, 2013

(54) ROTATING DEVICE

(75) Inventor: Cha-Biao You, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 905 days.

(21) Appl. No.: 12/479,933

(22) Filed: Jun. 8, 2009

(65) Prior Publication Data

US 2010/0278638 A1 Nov. 4, 2010

(30) Foreign Application Priority Data

Apr. 30, 2009 (CN) .......................... 2009 1 0302037

(51) Int. Cl.
*B65G 17/48* (2006.01)
(52) U.S. Cl. ................. 198/377.01; 198/375; 198/478.1
(58) Field of Classification Search .................. 198/375, 198/377.01, 377.04, 377.08, 478.1, 482.1; 406/93, 94
See application file for complete search history.

(56) References Cited

U.S. PATENT DOCUMENTS

| | | | | |
|---|---|---|---|---|
| 3,645,581 A | * | 2/1972 | Lasch et al. ..................... | 406/31 |
| 3,647,149 A | * | 3/1972 | Morita et al. ................... | 241/65 |
| 4,832,173 A | * | 5/1989 | Hattori et al. ............. | 198/377.1 |
| 4,880,021 A | * | 11/1989 | Haberstroh ..................... | 134/62 |
| 5,002,455 A | * | 3/1991 | Kuriyama et al. ......... | 198/339.1 |
| 5,107,981 A | * | 4/1992 | Markus ......................... | 198/721 |
| 5,108,513 A | * | 4/1992 | Muller et al. ................... | 134/15 |
| 5,119,929 A | * | 6/1992 | Carlson .................... | 198/377.06 |
| 5,388,682 A | * | 2/1995 | Dudley ......................... | 198/367 |
| 6,145,650 A | * | 11/2000 | Christ et al. .................. | 198/493 |
| 6,213,011 B1 | * | 4/2001 | Dubuit ............................ | 101/35 |
| 6,467,398 B2 | * | 10/2002 | Fink et al. ....................... | 99/330 |
| 7,121,399 B2 | * | 10/2006 | Mills ............................. | 198/438 |
| 7,631,745 B2 | * | 12/2009 | Steffen et al. ............ | 198/377.08 |
| 7,849,608 B2 | * | 12/2010 | Turatti ............................. | 34/58 |

* cited by examiner

*Primary Examiner* — Douglas Hess
(74) *Attorney, Agent, or Firm* — Altis Law Group, Inc.

(57) ABSTRACT

A rotating device includes a wind machine, a transmission mechanism, and a vane rotatably mounted to the transmission mechanism. The wind machine is adjacent to the transmission mechanism, used to rotate the vane.

20 Claims, 5 Drawing Sheets

ROTATING DEVICE

BACKGROUND

1. Technical Field

The present disclosure relates to a rotating device and, particularly, to a rotating device used in a spraying process.

2. Description of Related Art

With the development of technology, consumers bring forward high-level requirements for portable electronic devices, e.g., mobile phones and personal digital assistants (PDAs). Thus, surface spraying treatment is an important step during manufacture of portable electronic devices.

To uniformly spray surfaces, a portable electronic device is usually fixed to a transmission belt. The transmission belt includes a self-rotating device. The portable electronic device is mounted on the self-rotating device. The self-rotating device includes an electrical motor, a driving belt, and a spindle. The spindle is connected to the electrical motor by the driving belt. The driving belt rotates the spindle in the direction as controlled by the electrical motor.

However, the self-rotating device is complex and difficult to maintain. Furthermore, dust generated by the driving belt is easy to contaminate the portable electronic device.

Therefore, there is room for improvement within the art.

BRIEF DESCRIPTION OF THE DRAWINGS

Many aspects of the rotating device can be better understood with reference to the following drawings. These drawings are not necessarily drawn to scale, the emphasis instead being placed upon clearly illustrating the principles of the present rotating device. Moreover, in the drawings like reference numerals designate corresponding sections throughout the several views.

DETAILED DESCRIPTION

The present rotating device is used to drive small and light products to rotate, e.g., to rotate a portable electronic device during spraying process. In this exemplary embodiment, the present rotating device is used to rotate two mobile phones 20.

Figure 1:
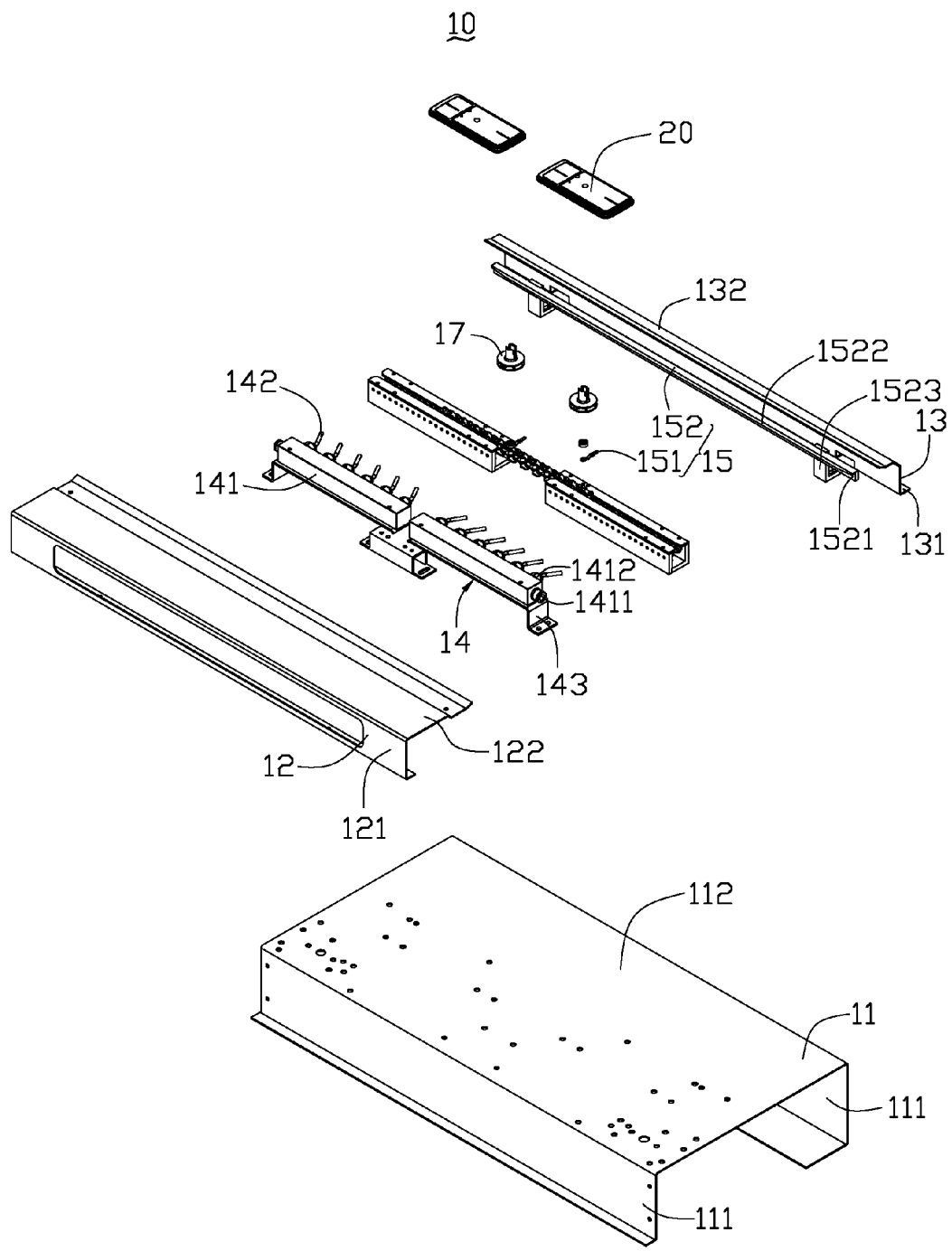
FIG. 1 is an isometric, exploded view of a rotating device, in accordance with an exemplary embodiment.

FIG. 1 shows an exemplary embodiment of the present rotating device. The rotating mechanism 10 includes a supporting platform 11, a first shielding cover 12, a second shielding cover 13, two wind machines 14, a stopping mechanism 15, a transmission mechanism 16, and two vanes 17. The first shielding cover 12, the second shielding cover 13, the wind machines 14 and the transmission mechanism 16 are mounted on the supporting platform 11. The vanes 17 are rotatably mounted on the transmission mechanism 16. The wind machines 14 are aligned with the transmission mechanism 16. The first shielding cover 12 and the second shielding cover 13 are used to cooperatively shield the transmission mechanism 16. The stopping mechanism 15 is used to stop the vanes 17.

The supporting platform 11 may be a generally "U"-shaped platform, including two first supporting legs 111 and a supporting body 112. The two first supporting legs 111 respectively extend from two opposite sides of the supporting body 112 to support the supporting body 112. The supporting body 112 mounts the first shielding cover 12, the second shielding cover 13, the wind machines 14 and the transmission mechanism 16.

The first shielding cover 12 may be an "L"-shaped cover, including a first supporting wall 121 and a first shielding wall 122 perpendicularly connected to the first supporting wall 121. The supporting wall 121 is fixed to the supporting platform 11. In the exemplary embodiment, the supporting wall 121 is screwed to the supporting platform 11.

The second shielding cover 13 may also be an "L"-shaped cover, including a second supporting wall 131 and a second shielding wall 132 perpendicularly connected to the second supporting wall 131. The second supporting wall 131 is fixed to the supporting platform 11. In the exemplary embodiment, the second supporting wall 131 is screwed to the supporting platform 11.

Each wind machine 14 includes a manifold 141 and, in this embodiment, several nozzles 142. The manifold 141 is generally rectangular. The manifold 141 includes an inlet 1411 and several outlets 1412. The outlets 1412 are in line, facing the transmission mechanism 16. Each outlet 1412 communicates with a corresponding nozzle 142. In the exemplary embodiment, the inlet 1411 is defined at one end of the manifold 141, communicating with a high-pressure gas resource, e.g., compressed air. The wind machines 14 are fixed to the supporting body 112 by several fastening legs 143. In the exemplary embodiment, the fastening legs 143 are located on both sides of each wind machine 14.

Figure 2:
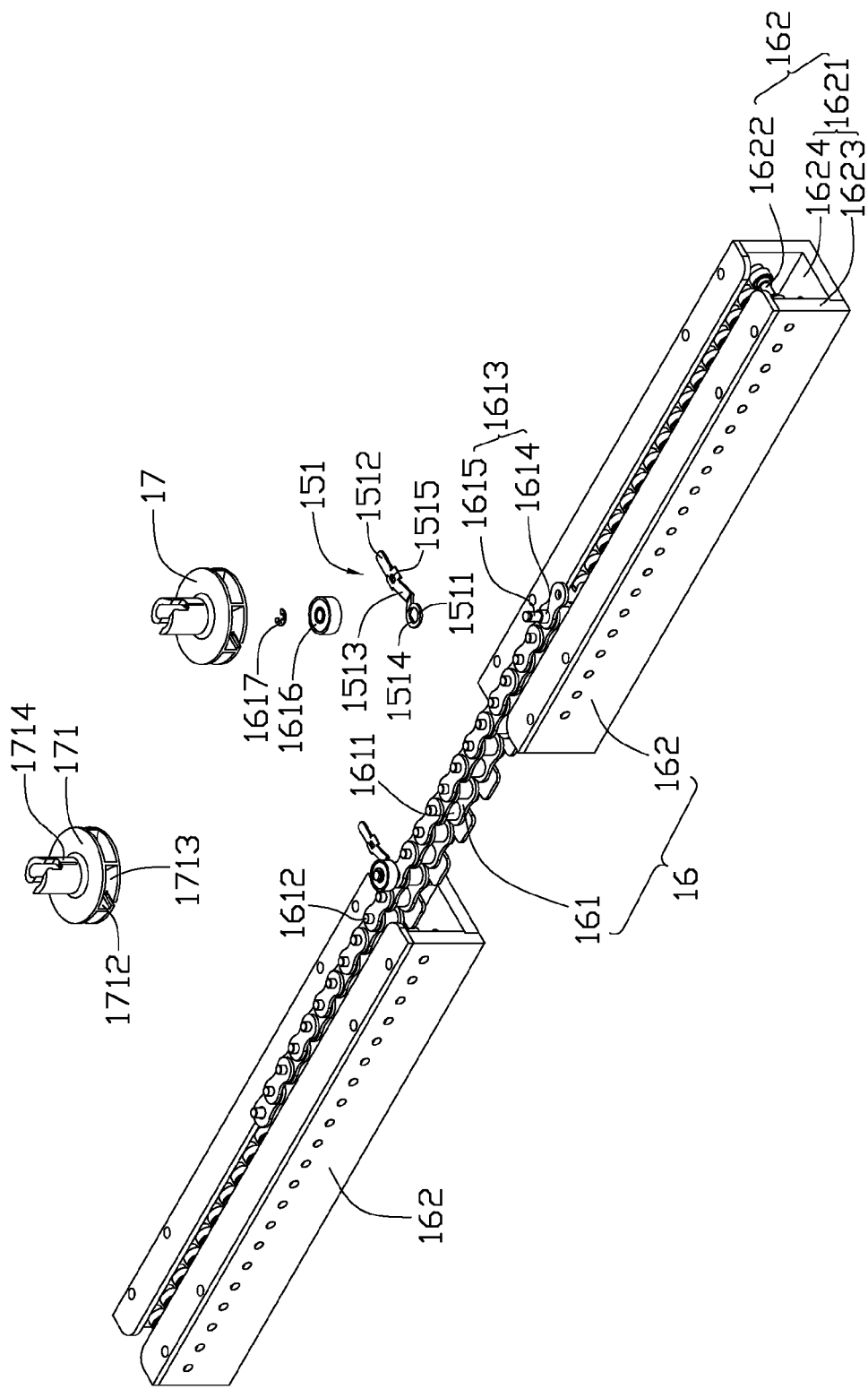
FIG. 2 is an isometric, exploded view of the transmission mechanism and the vane shown in FIG. 1.

Referring to FIGS. 1 and 2, the stopping mechanism 15 includes an elastic sheet 151 and a pressing board 152. The elastic sheet 151 is a thin sheet, including a fastening end 1511, a latching end 1512, and a connecting portion 1513. The fastening end 1511 defines a through hole 1514. The through hole 1514 is used to mount the elastic sheet 151 to the transmission mechanism 16. The connecting portion 1513 bends away from the transmission mechanism 16, thus making the latching end 1512 elastically abut against the corresponding vane 17. The latching end 1512 defines a latching hole 1515, used to latch a vane 17 thereon. The pressing board 52 is an "L"-shaped board, including a mounting portion 1521, a pressing portion 1522 connected to the mounting portion 1521, and two second supporting legs 1523. The two second supporting legs 1523 are "L"-shaped. The mounting portion 1521 is fixed to the supporting body 112 by the two second supporting legs 1523, adjacent to the transmission mechanism 16. The pressing portion 1522 faces the transmission mechanism 16, used to press the latching end 1512 towards the supporting platform 11 to separate the latching end 1512 away from the vane 17.

The transmission mechanism 16 includes a chain 161 and two bearings 162. The chain 161 includes several chain links 1611 and several connecting poles 1612. The connecting poles 1612 connect the chain links 1611 to form a chain. Two of the connecting poles 1612 are longer and extend out of the corresponding chain links 1611 to form two spindles 1613. Each spindle 1613 includes a head portion 1614 and a column 1615 protruding from the head portion 1614. The column 1615 has a greater diameter than the head portion 1614. The head portion 1614 is used to fix a round spindle collar 1616 thereon. The spindle collar 1616 is fixed to the spindle 1613 by a latching ring 1617. The spindle collar 1616 is rotatably mounts the vane 17 to the spindle 1613. Each bearing 162 includes a base 1621 and several spaced parallel shafts 1622. The base 1621 is a hollow, "U"-shaped shelf and includes two opposite sidewalls 1623 and a mounting wall 1624 connected to the two sidewalls 1623. The mounting wall 1624 is mounted to the supporting body 112. In the exemplary embodiment, the mounting wall 1624 is screwed to the supporting body 112. The two sidewalls 1623 are used to rotatably mount the several shafts 1622 thereon. The several shafts 1622 bear the chain 161 thereon, and the chain 161 slides on the several shafts 1622 driven by a power generator (not shown).

Figure 3:
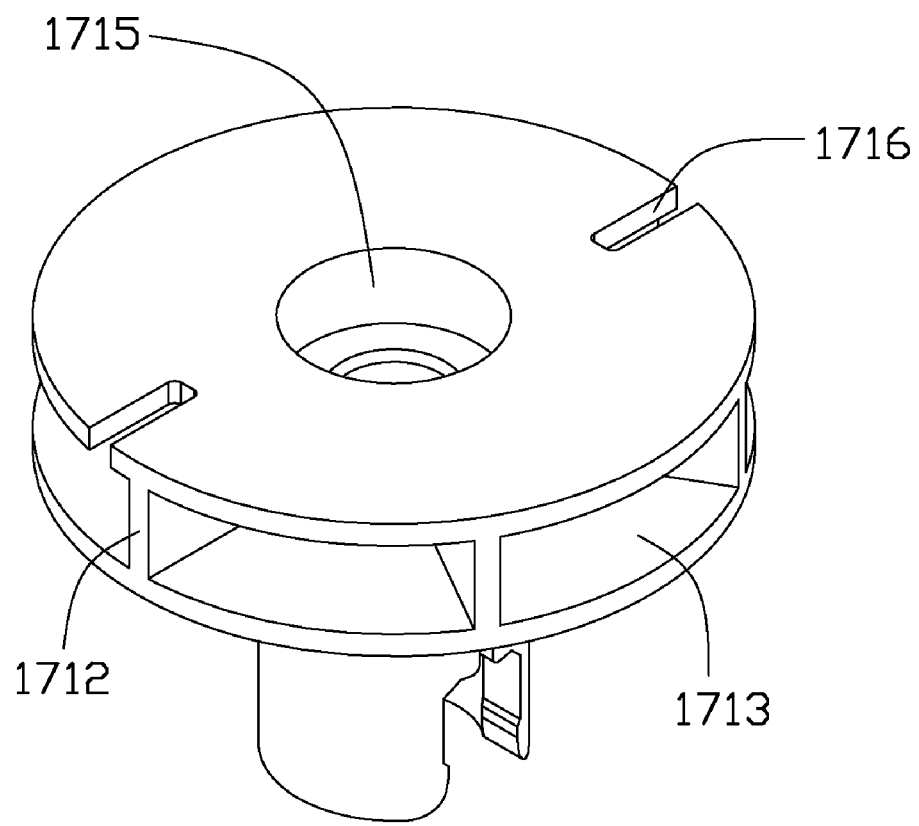
FIG. 3 is an isometric view of the vane shown in FIG. 1.

Referring to FIG. 3, each vane 17 includes a main portion 171. The main portion 171 is round disc having a hollow portion divided into several pie-shaped chambers 1713 by several partitions 1712. The main portion 171 includes a positioning pole 1714 protruding from one end thereof and a shaft hole 1715 defined at the other end. The positioning pole 1714 is used to position the mobile phone 20 (see FIG. 1). The shaft hole 1715 is used to receive the spindle collar 1616 therein. The positioning pole 1714 includes two opposite latching portions 1716 protruding therefrom, surrounding the shaft hole 1715. The latching portions 1716 are used to latch into the latching hole 1515.

Figure 4:
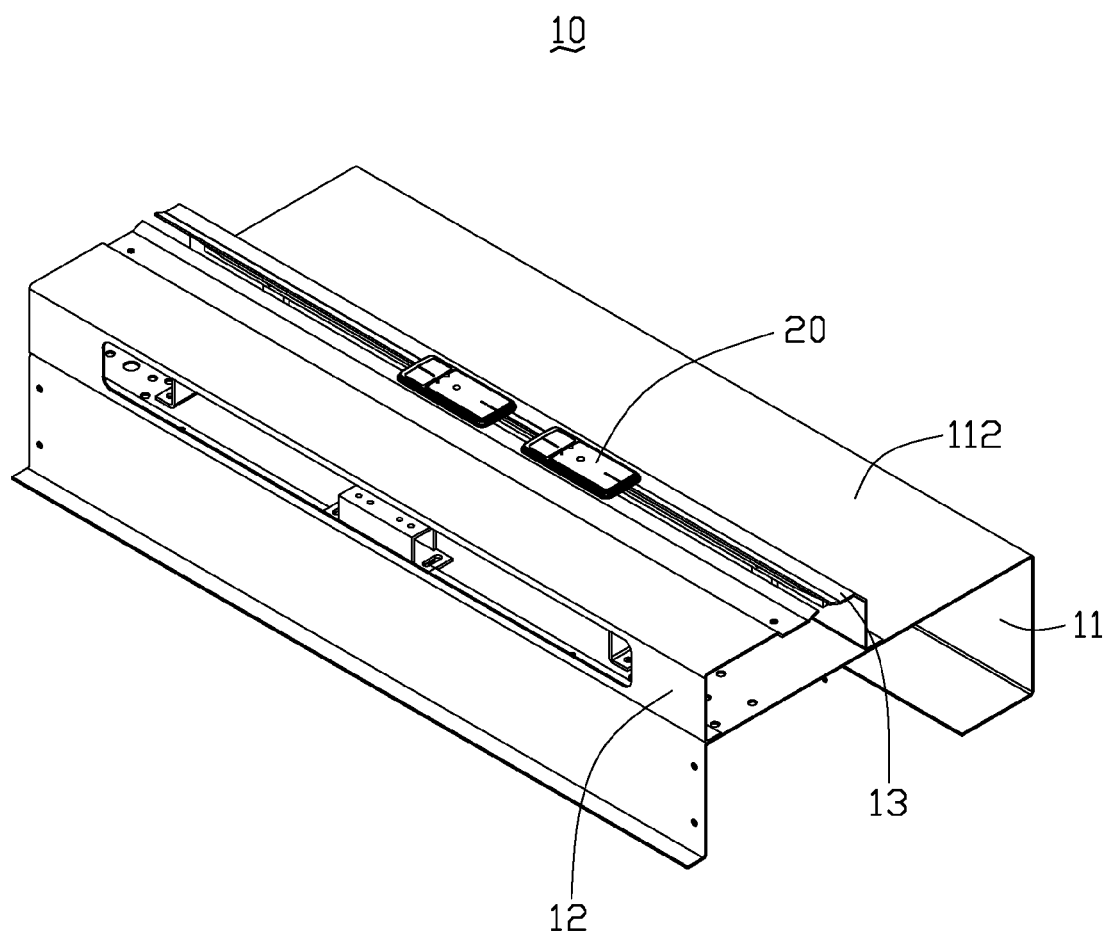
FIG. 4 is an assembled view of the rotating device shown in FIG. 1.
Figure 5:
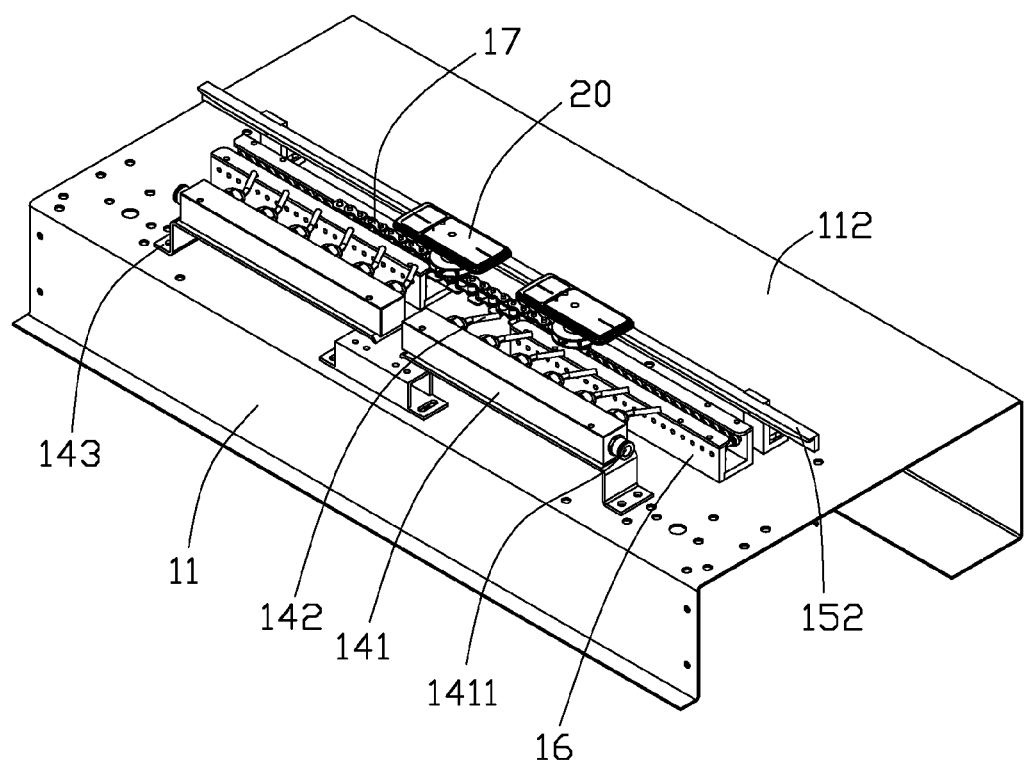
FIG. 5 is a partially assembled view of the rotating device shown in FIG. 1.

Referring to FIGS. 4 and 5, in assembly, the bearings 162 are mounted to the supporting platform 11. The chain 161 is placed on the shafts 1622 of the two bearings 162. The two vanes 17 are rotatably engaged with the two spindle collars 1616. The pressing board 152 of the stopping mechanism 15 is fixed to the supporting platform 11, adjacent to a side of the two bearings 162 of the transmission mechanism 16. The pressing board 152 can press the elastic sheet 151 to separate the elastic sheet 151 from the main portion 171 of the vane 17. The two wind machines 14 are fixed to the supporting platform 11. The first shielding cover 12 and the second shielding cover 13 are oppositely mounted to the supporting platform 11, cooperatively covering the wind machines 14, the stopping mechanism 15, the transmission mechanism 16 and the vanes 17.

When the chain 161 slides on the shafts 1622, the wind machines 14 are connected to the high-pressure gas resources, the high-pressure gas flows from the nozzles 142 of the wind machines 14 towards the corresponding vanes 17 to rotate the vanes 17. Thus, the rotating direction of the vanes 17 can be controlled by adjusting the aim of the nozzles 142. When the latching end 1512 is released from the pressing board 152 as the vanes 17 slide on the shafts 1622, the elastic sheet 151 restores to its original state and abuts against the main portions 171 of the corresponding vane 17 until the latching point 1716 latches into the latching holes 1515, thus stopping the vanes 17.

The rotating device 10 makes use of the high-pressure gas resource as the power source to rotate the vanes 17 and the mobile phones 20, has simple configuration and is easy to maintain, thus reducing costs.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of sections within the principles of the disclosure to the full extent indicated by the broad general meaning of the terms, in which the appended claims are expressed.

What is claimed is:

1. A rotating device comprising:
    a wind machine;
    a transmission mechanism; and
    a vane rotatably mounted to the transmission mechanism, the wind machine being adjacent to the transmission mechanism, the wind machine being used to rotate the vane.

2. The rotating device as claimed in claim 1, wherein the wind machine includes a manifold and several nozzles, the manifold includes an inlet and several outlets, the several outlets are in line, facing the transmission mechanism, each outlet communicates with a corresponding nozzle.

3. The rotating device as claimed in claim 1, wherein the transmission mechanism includes a chain, the chain includes a spindle protruding therefrom, the vane is rotatably mounted to the spindle.

4. The rotating device as claimed in claim 3, wherein the spindle includes a head portion and a column protruding from the head portion, the column is larger in diameter than the head portion, the head portion is used to fix a spindle collar thereon, the spindle collar is fixed to the spindle, the spindle collar is used to rotatably mount the vane to the spindle.

5. The rotating device as claimed in claim 4, wherein the vane includes a main portion, the main portion includes a hollow portion, the hollow portion divided into several chambers by several partitions.

6. The rotating device as claimed in claim 5, wherein the main portion includes a positioning pole protruding from one end and a shaft hole defined at the other end, the positioning pole is used to position a product, the shaft hole is used to receive the spindle collar therein.

7. The rotating device as claimed in claim 6, wherein the positioning pole includes two opposite latching portions protruding therefrom and surrounding the shaft hole, the rotating device further includes an elastic sheet, the elastic sheet defines a latching hole, the latching portions are used to latch into the latching hole.

8. The rotating device as claimed in claim 7, further including a pressing board, wherein the pressing board is used to press the elastic sheet to separate the elastic sheet from the vane.

9. The rotating device as claimed in claim 3, further including a bearing, wherein the bearing includes several shafts, the several shafts are parallelly and spacedly disposed, used to bear the chain thereon.

10. The rotating device as claimed in claim 1, further including a supporting platform, a first shielding cover, and a second shielding cover, the first shielding cover, the second shielding cover and the wind machine are mounted on the supporting platform, the first shielding cover and the second shielding cover are used to cooperatively shield the transmission mechanism.

11. A rotating device comprising:
    a wind machine;
    a transmission mechanism;
    a stopping mechanism; and
    a vane rotatably mounted to the transmission mechanism, the wind machine being adjacent to the transmission mechanism, the wind machine being used to rotate the vane, the stopping mechanism being used to stop the vane.

12. The rotating device as claimed in claim 11, wherein the wind machine includes a manifold and several nozzles, the manifold includes an inlet and several outlets, the several outlets are in line, facing the transmission mechanism, each outlet communicates with a corresponding nozzle.

13. The rotating device as claimed in claim 11, wherein the transmission mechanism includes a chain, the chain includes a spindle protruding therefrom, the vane is rotatably mounted to the spindle.

14. The rotating device as claimed in claim 13, wherein the spindle includes a head portion and a column protruding from the head portion, the column is larger in diameter than the head portion, the head portion is used to fix a spindle collar thereon, the spindle collar is fixed to the spindle, the spindle collar is used to rotatably mount the vane to the spindle.

15. The rotating device as claimed in claim 14, wherein the vane includes a main portion, the main portion includes a hollow portion, the hollow portion divided into several chambers by several partitions.

16. The rotating device as claimed in claim 15, wherein the main portion includes a positioning pole protruding from one end and a shaft hole defined at the other end, the positioning pole is used to position a product, the shaft hole is used to receive the spindle collar therein.

17. The rotating device as claimed in claim 16, wherein the positioning pole includes two opposite latching portions protruding therefrom, surrounding the shaft hole, the stopping mechanism includes an elastic sheet, the elastic sheet defines a latching hole, the latching portions are used to latch into the latching hole.

18. The rotating device as claimed in claim 17, wherein the stopping mechanism further includes a pressing board, the pressing board is used to press the elastic sheet to separate the elastic sheet from the vane.

19. The rotating device as claimed in claim 13, further including a bearing, wherein the bearing includes several shafts, the several shafts are parallelly and spacedly disposed, used to bear the chain thereon.

20. The rotating device as claimed in claim 11, further including a supporting platform, a first shielding cover, and a second shielding cover, the first shielding cover, the second shielding cover and the wind machine are mounted on the supporting platform, the first shielding cover and the second shielding cover are used to cooperatively shield the transmission mechanism.

* * * * *